United States Patent [19]

Oku et al.

[11] Patent Number: 4,925,525

[45] Date of Patent: May 15, 1990

[54] PROCESS FOR PRODUCING A PRINTED CIRCUIT BOARD

[75] Inventors: Shunji Oku; Yoshiyuki Mizumo; Kiyoshi Seigenji, all of Osaka, Japan

[73] Assignee: Minolta Camera Kabushiki Kaisha, Osaka, Japan

[21] Appl. No.: 335,599

[22] Filed: Apr. 10, 1989

[30] Foreign Application Priority Data

Apr. 11, 1988 [JP] Japan .................. 63-90133

[51] Int. Cl.⁵ .................. B44C 1/22; C03C 15/00; C23F 1/02; B29C 37/00
[52] U.S. Cl. .................. 156/652; 29/846; 156/656; 156/659.1; 156/661.1; 156/666; 156/902; 204/23; 428/209; 428/601; 428/901; 430/318
[58] Field of Search ........... 156/650, 652, 656, 659.1, 156/661.1, 666, 901, 902; 204/15, 20, 23, 32.1, 40; 174/68.5; 29/846, 847; 427/96; 428/209, 601, 901; 361/397; 430/312, 313, 314, 315, 316, 318

[56] References Cited

U.S. PATENT DOCUMENTS

| | | | |
|---|---|---|---|
| 3,075,866 | 1/1963 | Baker et al. | 156/659.1 X |
| 3,115,423 | 12/1963 | Ashworth | 156/656 X |
| 3,169,063 | 2/1965 | Johnston et al. | 156/901 X |
| 4,080,513 | 6/1978 | Cuneo et al. | 174/68.5 |

FOREIGN PATENT DOCUMENTS

| | | |
|---|---|---|
| 55-59795 | 5/1980 | Japan . |
| 55-120194 | 9/1980 | Japan . |
| 55-148489 | 11/1980 | Japan . |
| 38291 | 11/1985 | Japan . |

Primary Examiner—William A. Powell
Attorney, Agent, or Firm—Price, Gess & Ubell

[57] ABSTRACT

A method of making a printed circuit board includes providing a substrate coated with a conductive layer, developing a first photoresist layer on the conductive layer to define a first conductive pattern of the desired circuit configuration having a plurality of discontinuous segments, and a second conductive pattern interconnecting the discontinuous segments of the desired circuit configuration. A second layer of photoresist is positioned across the whole surface of the substrate except at least a selected portion of the first conductive pattern, and the substrate is electrically activated during a coating process for depositing conductive material on the selected portion of the first conductive pattern. The first conductive pattern is subsequently coated with photoresist, and the second conductive pattern, which is now exposed on the substrate, is subject to an etching process to effectively remove all of the second conductive pattern.

18 Claims, 6 Drawing Sheets

RELATING ART

PROCESS FOR PRODUCING A PRINTED CIRCUIT BOARD

BACKGROUND OF THE INVENTION

1. Field of the Invention

The present invention relates to processes for the production of a printed circuit board and, more particularly, to processes for facilitating the electrodepositing of closely compacted conductive patterns in an economic and efficient manner.

2. Description of Related Art

A large number of processes and resultant printed circuit boards have been proposed in the last 35 years to meet the demands of the electronics industry. The miniaturization of electronic components and the reduction in size of the supporting printed circuit boards have imposed additional constraints on manufacturers of modern printed circuit boards. Various forms of clad and strip processing techniques have been suggested and utilized in the manufacturing of printed circuit boards. An example of one technique and a summary of other prior art techniques are set forth in U.S. Pat. No. 4,080,513.

In a conventional process for manufacturing a printed circuit board, a number of independent conductive strips or patterns are isolated on an insulating substrate. These patterns of independent strips must be electrically interconnected to facilitate a electroplating step of depositing desired conductive material on certain areas of the substrate. This can be accomplished by temporarily connecting the desired conductive patterns with a secondary pattern of plating lead layers to carry the plating current. This secondary plating lead layer, however, is only necessary as an intermediate step in the production of the printed circuit board. The desired primary conductive strips must again be electrically isolated to achieve the desired conductive interconnection between the electronic component parts that are to be mounted on the printed circuit board. Thus, it is known that the electrical interconnection between the independent primary conductive pattern must be removed before the printed circuit board is finished.

Figure 11:
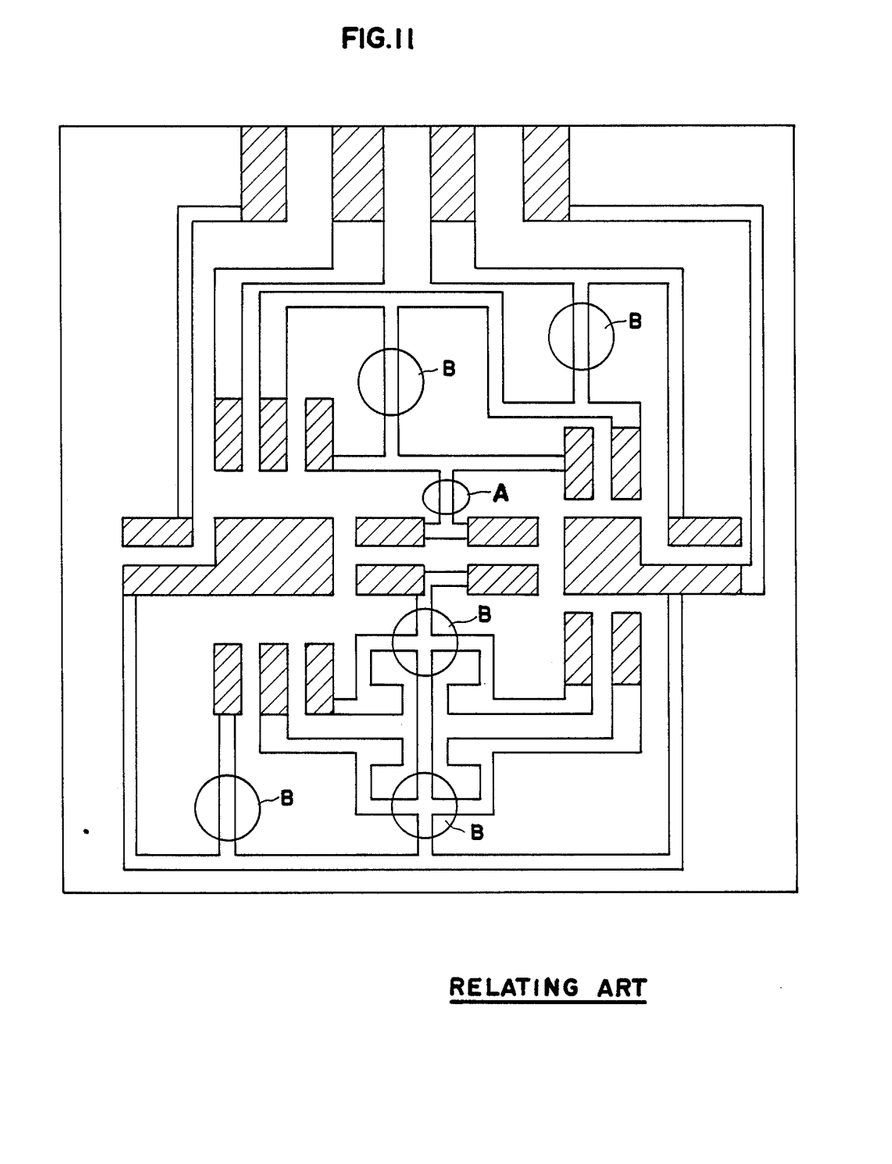
FIG. 11 is a plan view of a printed circuit board of the prior art showing a method for removing a pattern of conductive plating lead layers that are interconnecting independent primary conductive patterns on the conventional printed circuit board.

A prior art method of removing or isolating the independent electrical components from each other is disclosed in FIG. 11, wherein the pattern of plating lead layers are physically cut off by drilling holes in the printed circuit board. Thus, in FIG. 11 the circled portions B indicate drilled holes where the electrical connection between the independent primary conductive patterns has been effectively removed. As can be readily appreciated, by simply cutting off the pattern of plating lead layers with a hole drilling technique, there still remain cut off sections of the pattern of plating lead layers which are exposed and remain in contact with the desired independent conductive segments of the printed circuit board. Thus, there remains a risk that these independent components may be shorted out or connected with another cut off section through unintentional contact with conductive material to bridge the drilled hole.

An additional problem occurs in any production process desiring to produce a printed circuit board of an extremely high density. In such a design, the space between the respective conductive lines represents a distinct limitation on the compacting of the circuit pattern. Utilizing a plating lead layer to interconnect the independent conductive segments while permitting a drilling or cutting off of the lead line, which is part of the finishing step, clearly creates a significant design problem. The deposited primary conductive pattern must be designed so that any essential component of conductive material in the desired final pattern should not be endangered in being cut off through any drilling step. If the design suggests that the plating lead layer must be positioned in a space between desired conductive segments which is smaller than the diameter of a drill, for example, as shown by circle A in FIG. 11, an alternative step, such as a grinding or an abrading step, would be necessary.

In one conventional process for producing a printed circuit board, a pattern of a primary electroconductive layer and a pattern of a plating lead layer are created on an insulating substrate. This is accomplished, for example, by etching a surface of a copper clad laminate substrate. Subsequently, predetermined portions of the final conductive pattern are plated electrically to deposit an additional conductive material. Finally, any interconnecting patterns of plating lead layers are removed by drilling or grinding to provide the final configuration of the printed circuit board.

There is still a desire in the field of manufacturing printed circuit boards to improve the production processes in an efficient manner to produce highly accurate and concisely defined printed circuit board conductive patterns while eliminating the possibility of short circuits.

SUMMARY OF THE INVENTION

An object of the present invention is to provide an improved process for producing a printed circuit board while simplifying the number of processing steps necessary to accomplish this goal.

Another object of the present invention is to provide a process for producing a printed circuit board wherein a pattern of an intermediate plating coating lead layer will have no exposed sections in the finished printed circuit board.

A further object of the present invention is to provide a process for producing a printed circuit board wherein a pattern of electroconductive layers can be densely packed on the printed circuit board substrate to meet the needs of modern industry.

The present invention comprises a method of making a printed circuit board through the provision of an insulating substrate coated with a conductive layer. A photoresist layer can be developed above the conductive layer to define a first conductive pattern of the desired circuit configuration having a plurality of discontinuous conductive segments. Additionally, a second conductive pattern is also provided for interconnecting the discontinuous segments of the desired circuit configuration. The exposed conductive layer on the substrate is then removed, for example, in an etching bath, to leave both the first and second conductive patterns. The protective photoresist layer is then eliminated, and a second photoresist layer is utilized to cover the whole surface of the substrate except the first conductive pattern or at least selective areas of the first conductive pattern. The circuit board is then electrically connected and placed in an electrolyte bath with electric current being passed through the conductive patterns for depositing the desired thickness of a conductive material, such as gold or solder, on the exposed first conductive pattern, or the exposed selective areas of the first conductive pattern, such as terminal pads. The second photoresist layer is then eliminated. A third photoresist layer is developed on the whole surface of the substrate to permit the exposure of only the second conductive pattern. Finally, the second conductive pattern is etched away from the substrate to provide the final configuration of the primary first conductive pattern as the finished printed circuit board configuration. The third photoresist layer is then eliminated.

The features of the present invention which are believed to be novel are set forth with particularity in the appended claims. The present invention, both as to its organization and manner of operation, together with further objects and advantages thereof, may best be understood by reference to the following description, taken in conjunction with the accompanying drawings.

DESCRIPTION OF THE PREFERRED EMBODIMENTS

The following specification, taken in conjunction with the drawings, sets forth both the process steps and product of the present invention in such a manner to enable any person skilled in the art to utilize the invention. The embodiments of the invention disclosed herein are the best modes contemplated by the inventors of carrying out their invention in a commercial environment, although it should be understood that various modifications can be accomplished within the parameters of the invention. A printed circuit board production process according to a first embodiment of the present invention will be subsequently described in conjunction with FIGS. 1 through 6.

Figure 1:
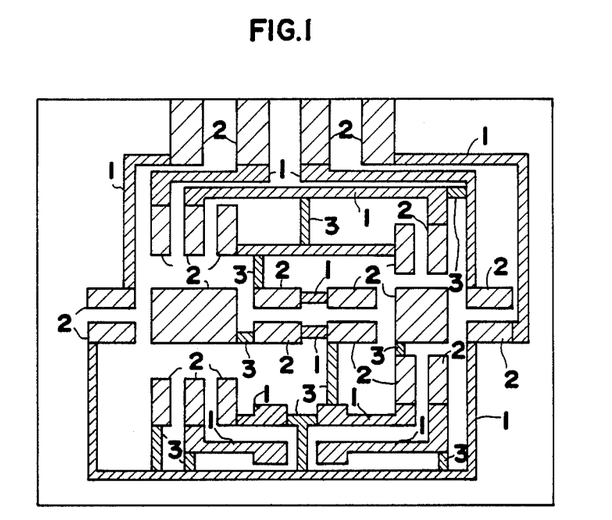
FIG. 1 is a plan view of a printed circuit board showing the exposed surfaces of a copper clad laminate substrate coated with a photoresist layer to provide the primary first conductive pattern of the desired circuit configuration and the second conductive pattern of the interconnecting lead layers to provide a path for electric current throughout the discontinuous segments of the desired circuit's configuration.
Figure 2:
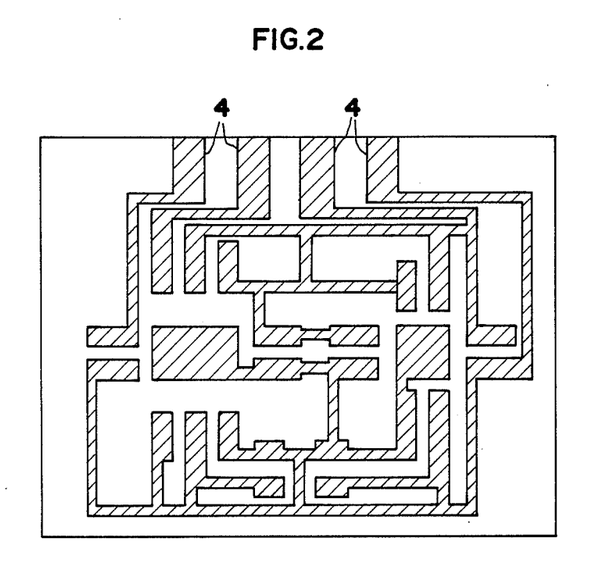
FIG. 2 discloses a plan view of the printed circuit board after the initial process steps of providing the first and second conductive patterns.

In FIG. 1, the shaded portions 1 and 2 represent the desired portions of a pattern of an electroconductive layer of a desired circuit configuration. As can be seen, these elements can comprise a plurality of discontinuous segments of conductive patterns on a supporting substrate. The substrate is nonconductive and may be rigid or flexible, as known in the industry. The shaded portions 2, which can be distinguished by the wider parallel lines than that of the shaded portions 1, are desired to be plated electrically by an electrodeposition technique to provide wider mounting pads which can be used, for example, for mounting electrical components onto the printed circuit board. The additional deposition on these terminal pads can facilitate a mounting, positioning and securement procedure, such as soldering. The shading portions 1 provide a conductive interconnection between the respective mounting pads. A series of smaller shaded portions 3 represent a second conductive pattern that interconnects the discontinuous segments of various combinations of shaded portions 1 and 2. The shaded portions 3 represent a conductive portion of a plating lead layer specifically designed to provide a continuous electrically conductive path across the entire surface of the printed circuit board.

As can be appreciated, various forms of preparatory steps in the manufacture of the printed circuit board can be accomplished, and different techniques can be utilized for depositing conductive material on a printed circuit board. These techniques and the various materials are known to people skilled in this field and, accordingly, it is not believed necessary to repeat this common information in this description. Different types of conductive metal can be utilized in an electroplating technique according to the objects of the present invention. For example, if a terminal connection of an integrated circuit component and the pattern of an electroconductive layer are to be wire bounded with a gold wire, then gold can be used for electroplating. Alternatively, if the terminal connection and the conductive pattern are to be soldered together, solder can be used for electroplating.

Referring to that portion of the process for the production of a printed circuit board that is relevant to the present invention, we can assume that the circuit board substrate is already coated with a thin copper clad laminate across the entire surface of an inert substrate. Referring to FIG. 1, the first step of the invention can be accomplished by coating the respective shaded areas 1, 2 and 3 with an etching-resistant layer. For example, various forms of protective material, such as a photoresist, can be applied to the substrate and permitted to dry to define the specific conductive pattern which is desired on the printed circuit board, including a supplemental second conductive pattern that will interconnect the discontinuous segments of the desired circuit configuration. The photoresist-coated substrate can then be dipped for a short period of time in an appropriate etchant solution such as an acid bath. The respective strength of the acid bath, the temperatures and the soaking times are interdependent and can be subjectively varied, as known in this field. The etched substrate is then removed from the acid bath, and the etching resist layer is also eliminated. Various rinsing and drying steps such as, for example, rinsing in a spray or water bath of deionized water are known and utilized in this field. The circuit board substrate now has a copper laminate configuration consisting of the shaded pattern 4 shown in FIG. 2.

Figure 3:
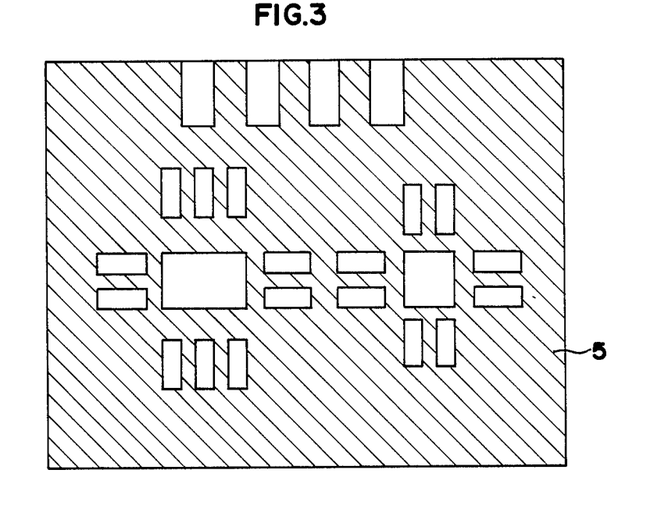
FIG. 3 shows a plan view of the printed circuit board indicating those portions of the printed circuit board that are to be coated with a plating photoresist layer to expose selected areas of the first conductive pattern for subsequent depositing of conductive material in an electrolyte solution.
Figure 4:
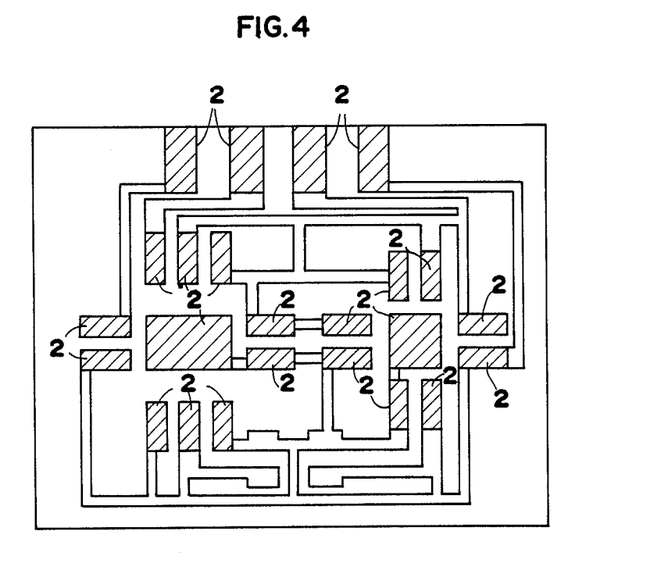
FIG. 4 discloses a plan view of the printed circuit board after depositing of conductive material on the selected areas of the first conductive pattern and the elimination of the photoresist.

Referring to FIG. 3, a second photoresist layer or plating resistive layer is then appropriately applied to the substrate as shaded portion 5. In essence, the shaded portions 2 shown in FIG. 1 are now left exposed in this process step. The resist-coated substrate is then soaked in an appropriate electrolyte bath after being electrically connected, so that electrical current is passed through the shaded portions 4 shown in FIG. 2 from an outside power source. For example, the shaded portions 2 in FIG. 1 may now be a cathode in the electrolyte solution. Consequentially, a conductive pattern shown in FIG. 4 can be established by the electrical plating in this step. As mentioned earlier, the specific plating of an electroconductive layer will be consistent with electronic component parts of the integrated circuit which are to be mounted on the board.

Figure 5:
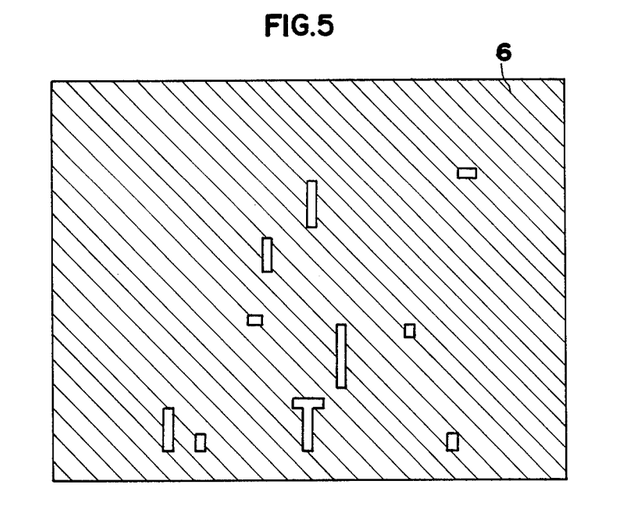
FIG. 5 shows a plan view of the printed circuit board covered with another layer of photoresist to permit the exposure of only the second conductive pattern.

Subsequently, the plating resistive layer 5 is eliminated, and again the substrate can be washed and dried, as mentioned above. Referring to FIG. 5, the shaded portions 6 of a third plating resistant layer or photoresist can be applied to the substrate, and the exposed areas shown are aligned with the portions 3 shown in FIG. 1. This exposed portion corresponds to the second conductive intermediate pattern that interconnected the discontinuous segments of the desired circuit configuration for purposes of electroplating. The photoresist-coated substrate is then soaked in an etching solution to etch away the shaded portions 3.

Figure 6:
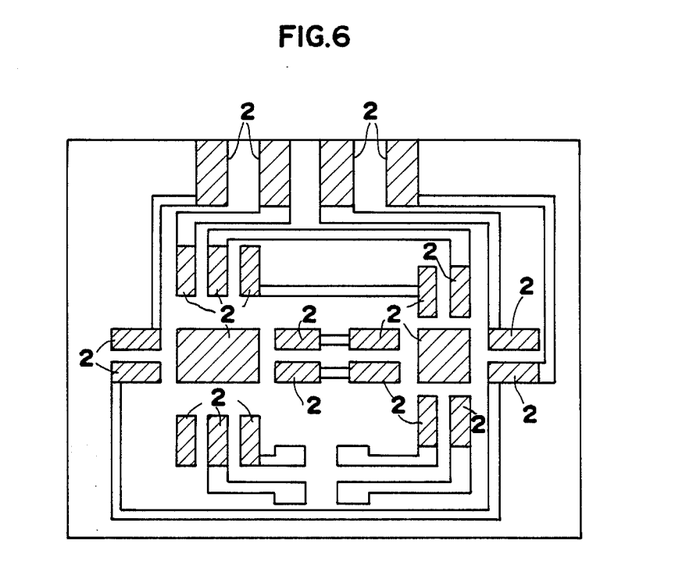
FIG. 6 shows a plan view of the final configuration of the printed circuit board after etching away of the second conductive pattern.

As a final processing step, the etching resist layer 6 can be eliminated in a conventional manner, with the printed circuit board appropriately washed and dried. As shown in FIG. 6, the shaded portions 3 in FIG. 1, that is, the pattern of an intermediate plating lead layer, has been effectively removed without leaving any undesirable conductive material on the substrate surface, such as may occur with a drilling or grinding process step. A protective cover layer can then be applied to the printed circuit board in order that the board is prepared for the subsequent mounting of the electrical component parts.

In summary, the insulating substrate was coated with a conductive layer such as copper, and a first photoresist layer on the conductive layer was developed to define a first conductive pattern of the desired circuit configuration having a plurality of discontinuous segments. A second conductive pattern or lead layer pattern was also provided for interconnecting the discontinuous segments of the desired circuit configuration. The remaining exposed conductive layer was then removed, for example, through an acid bath or spray system, to leave the first and second conductive patterns on the substrate. The first photoresist layer was then eliminated and a second photoresist layer was applied to cover the second intermediate conductive pattern, and to leave exposed only the desired terminal pads of the primary first conductive pattern for receiving the electronic component parts. A conductive material was then applied by electrically connecting the first and second conductive patterns in an appropriate electrolyte coating bath. The second photoresist layer was then eliminated, and a third photoresist layer was applied to cover the entire substrate except for the second intermediate conductive layer. This coated substrate was then placed in an appropriate etching acid bath so that the second conductive pattern was completely removed. The third photoresist layer was then eliminated, thereby providing the primary conductive pattern in a highly dense configuration without leaving any unwanted conductive surface portions associated with the second conductive pattern.

Referring to FIGS. 7 to 10, an alternative process for producing a printed circuit board is disclosed. In this process, the necessity of providing a second conductive pattern for interconnecting the discontinuous segments of the desired circuit configuration of the primary conductive pattern is unnecessary. In the subsequent FIGS. 7 through 10 be discussed herein, the pattern of the electroconductive layer and the desired portions thereof, wherein electroplating is to be provided, are identical to the shaded portions 1 and 2 in FIG. 1.

Figure 7:
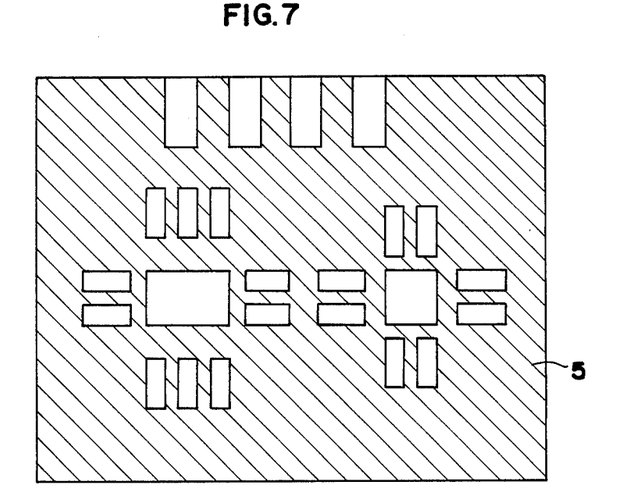
FIG. 7 shows a plan view of a printed circuit board in accordance with a second embodiment of the present invention wherein the desired portions of the primary first conductive pattern have been exposed to enable a depositing of conductive material.

Referring to FIG. 7, a shaded portion 5, for example, of a plating-resistant layer, is provided on the surface of a copper clad laminate. In this embodiment, the exposed portions are equivalent to the shaded portions 2 shown in FIG. 1. The photoresist-coated laminate is then soaked in an appropriate electrolyte, and an electric current flows across the entire copper laminate layer on the substrate so that the exposed surfaces of that laminate have a cathode relationship to the depositing anode terminal in the electrolyte bath. As a result, only the shaded portions 2 shown in FIG. 8 are plated.

Figure 8:
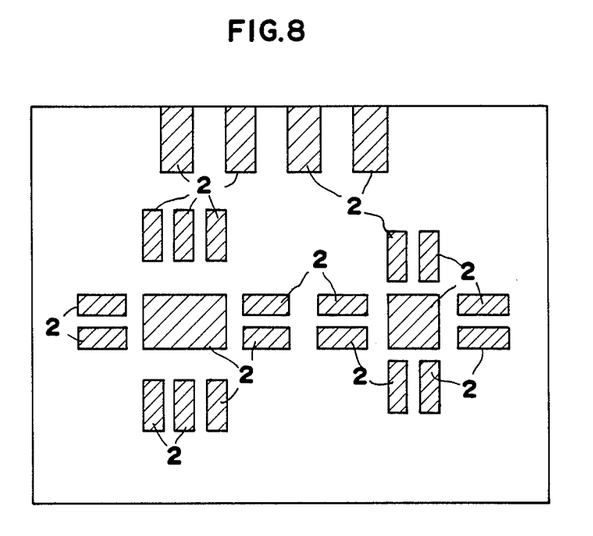
FIG. 8 shows a plan view of a printed circuit board after depositing of the conductive material.

It should be noted that the shaded portions 1 in FIG. 1 have not been formed at this time and, basically, the laminate has only a second layer of pads of conductive material 2 deposited on the shaded areas 2 on its surface in FIG. 8.

Figure 9:
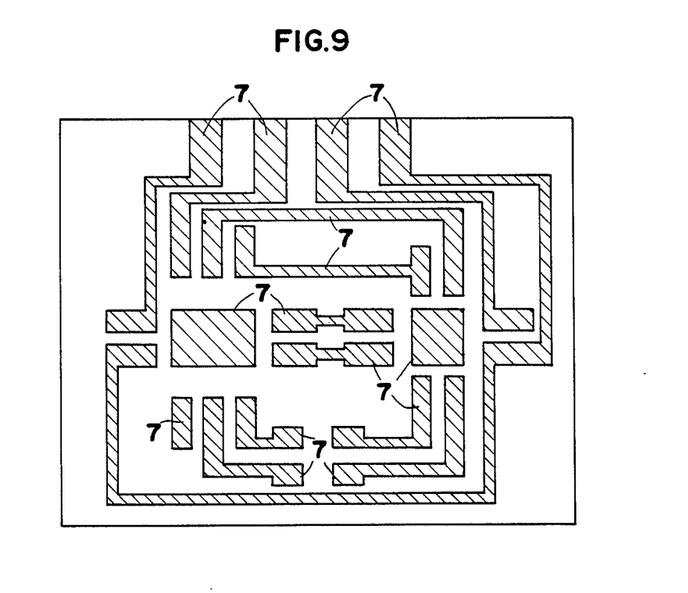
FIG. 9 shows a plan view of the printed circuit board wherein portions of the conductive pattern are coated with a photoresist layer.
Figure 10:
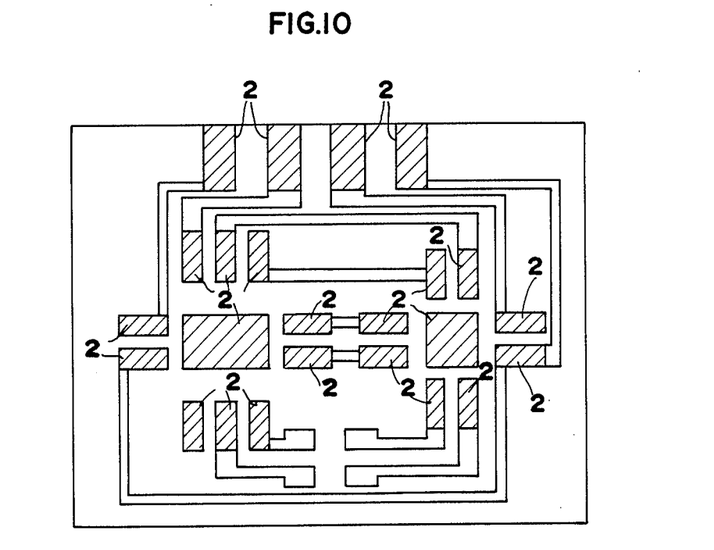
FIG. 10 shows a plan view of the final configuration of the printed circuit board after an etching step and elimination of the photoresistive material.

The plating resist layer 5 is eliminated and the laminate is appropriately washed and dried as mentioned above. Referring to FIG. 9, a second photoresist layer is then applied so that the shaded portions 7 shown in FIG. 9 are identical with the shaded portions 1 and 2 shown in FIG. 1 as a result of coating them with an etchant-resistant layer, such as a known photoresist material. The photoresist-coated laminate shown in FIG. 9 is then appropriately placed into an etching solution to leave a desired pattern of an electroconductive layer for a printed circuit board. The etchant-resistant layer is appropriately eliminated and the printed circuit board is washed and dried. The desired final printed circuit board is then provided, as shown in FIG. 10. A cover layer can then be applied to the printed circuit board.

The process of the present invention can be utilized with a relatively flexible printed circuit board substrate or with a relatively hard printed circuit board substrate. With a hard printed circuit board substrate, a solder resist layer can be printed on the surface of the electric circuit board instead of sticking a protective cover layer over the flexible printed circuit board.

In summary, the advantages of each of the processing procedures which represent the present invention are somewhat self-evident. With regard to the first embodiment, the prior cutoff sections of a pattern of plating lead layers are no longer exposed on the final printed circuit board configuration, since this material is effectively removed by the etching step instead of being conventionally cut off with a cutter or a drill. As can be readily appreciated, the desired final conductive pattern of the desired circuit configuration can be designed to be relatively compactly spaced, and it is not necessary to make allowances to provide sufficient space and location for a drilling or cutting processing step because a much smaller pattern of a plating lead layer can be removed by etching than by drilling or cutting. It is also possible to easily remove the pattern of a plating lead layer through the etching step and, of course, to remove all of the lead layer pattern, which frequently could not be done with a cutting or drilling step. The number of processing steps required in the first embodiment are relatively limited when compared to that of a conventional production process.

In the second embodiment, the electroplating step is applied directly to the surface of the copper clad laminate, and the copper layer deposited through the electroplating step can function as a plating lead layer. Consequently, the electric current can flow in a very uniform manner throughout all the portions to be plated, resulting in a well-controlled thickness of the plate layer. As with the first step, the pattern of the electroconductive layer that is ultimately desired to be provided on the printed circuit board can be compactly designed because an intermediate pattern of a plating lead layer is basically unnecessary. As can be appreciated, the number of required processing steps is even further limited than that of the first embodiment of the invention.

As can be appreciated, many of the parameters of the above processes can be varied within conventional knowledge, since they are interdependent depending upon terms of time, temperature, concentration, etc. While the present invention has been described with reference to the particular embodiments mentioned above, it should be understood that numerous modifications may be made by those skilled in the art without actually departing from the spirit and scope of the invention, which should be determined solely from the following claims.

What is claimed is:

1. A method of making a printed circuit board comprising the steps of:
    providing a substrate coated with a conductive layer;
    developing a first photoresist layer on the conductive layer to define a first conductive pattern of a desired circuit configuration having a plurality of first and second discontinuous segments and a second conductive pattern interconnecting the discontinuous segments of the desired circuit configuration;
    removing the exposed conductive layer to leave the first and second conductive patterns;
    eliminating the first photoresist layer;
    developing a second photoresist layer to cover the whole surface of the substrate except at least the first discontinuous segments of the first conductive pattern;
    depositing a conductive material on the first discontinuous segments of the first conductive pattern by electrically connecting the first and second conductive patterns in a coating bath;
    eliminating the second photoresist layer;
    developing a third photoresist layer on the whole surface of the substrate to permit the exposure of only the second conductive pattern;
    removing the second conductive pattern, and
    eliminating the third photoresist layer.

2. The method of claim 1 wherein the respective removing steps are performed by etching.

3. The method of claim 1 wherein the depositing step is performed by electroplating.

4. In a method of making a printed circuit board having a primary conductive pattern of a plurality of discontinuous conductive segments that can be interconnected by electrical components, the improvement comprising the steps of:
    providing a nonconductive substrate with a primary conductive pattern having a plurality of first and second discontinuous conductive segments and a secondary conductive pattern interconnecting the primary pattern's discontinuous conductive segments;
    covering the whole surface of the substrate except the first discontinuous conductive segments of the primary conductive pattern;
    electrically activating the primary and secondary conductive patterns in a coating bath to deposit a second conductive layer only above the first discontinuous conductive segments of the primary conductive pattern;
    covering the whole surface of the substrate to permit the exposure of only the secondary conductive pattern, and
    removing the secondary conductive pattern.

5. The method of claim 4 wherein the removing step is performed by etching.

6. The method of claim 4 wherein the second conductive layer is deposited by electroplating.

7. A process for producing a printed circuit board comprising the steps of:
    forming a first pattern of an electroconductive layer and a second pattern of a plating lead layer on a surface of an insulating substrate, said first pattern of electroconductive layer comprising a plurality of first and second electrically independent sections thereof, said second pattern of plating lead layer being electrically connected to each section of the first pattern of electroconductive layer in order to supply an electric current;
    plating the first independent sections of the first pattern of electroconductive layer by supplying an electric current through said first and second patterns;
    developing an etching resist layer on the whole surface of the substrate to leave said second pattern of the plating lead layer exposed, and
    removing said second pattern of the plating lead layer by etching in order to insulate the first pattern's independent sections from each other.

8. In a method of making a printed circuit board having a conductive pattern of a plurality of discontinuous conductive segments, the improvement comprising the steps of:
    providing a substrate coated with a first conductive layer;
    developing a first photoresist layer on the conductive layer to cover the whole surface of the substrate except at least a selected portion of the first conductive layer;
    depositing a second conductive layer on the selected portion by electrically activating the first conductive layer in a coating bath;
    eliminating the first photoresist layer;

developing a second photoresist layer on at least a predetermined portion of the first conductive layer and the second conductive layer deposited portion to define a conductive pattern of a desired circuit configuration;

removing the exposed first conductive layer to leave the conductive pattern, and eliminating the second photoresist layer.

9. The method of claim 8 wherein the removing step is performed by etching.

10. The method of claim 8 wherein the depositing step is performed by electroplating.

11. A process for producing a printed circuit board comprising the steps of:

providing an insulating substrate coated with a conductive layer;

electrically plating at least a predetermined portion of said conductive layer;

developing a resist layer on the plated portion and at least a predetermined unplated portion of said conductive layer in a desired circuit configuration;

removing the portions of said conductive layer not protected by said resist layer by etching, and eliminating said resist layer.

12. The method of claim 1 wherein gold is used as the conductive material.

13. The method of claim 4 wherein gold is used as the second conductive layer.

14. The method of claim 7 wherein the first independent sections of the first pattern of electroconductive layer are plated with gold.

15. The method of claim 8 wherein gold is used as the second conductive layer.

16. The method of claim 11 wherein gold is used for electrically plating the predetermined portion of the conductive layer.

17. A process for producing a printed circuit board comprising the steps of:

providing an insulating substrate coated with a conductive layer;

electrically plating at least a predetermined portion of said conductive layer;

developing a resist layer on at least a predetermined unplated portion of said conductive layer in a desired circuit configuration;

removing the portions of said conductive layer not protected by said resist layer by etching so as to leave said predetermined unplated portion and the plated portion of said conductive layer, and eliminating said resist layer.

18. The method of claim 17 wherein gold is used for electrically plating the predetermined portion of the conductive layer.

* * * * *